United States Patent [19]
Yoon

[11] Patent Number: 5,977,580
[45] Date of Patent: Nov. 2, 1999

[54] MEMORY DEVICE AND FABRICATION METHOD THEREOF

[75] Inventor: Hyun-Do Yoon, Seoul, Rep. of Korea

[73] Assignee: LG Semicon Co., Ltd., Cheongju, Rep. of Korea

[21] Appl. No.: 08/749,846

[22] Filed: Nov. 15, 1996

[30] Foreign Application Priority Data

Dec. 29, 1995 [KR] Rep. of Korea ........................ 95-67323

[51] Int. Cl.⁶ ............................................... H01L 29/78
[52] U.S. Cl. .......................... 257/306; 257/307; 257/308; 257/532; 257/67
[58] Field of Search .................................. 257/306, 307, 257/308, 532, 67, 74

[56] References Cited

U.S. PATENT DOCUMENTS

| | | | |
|---|---|---|---|
| 4,864,464 | 9/1989 | Gonzalez | 257/296 |
| 5,091,762 | 2/1992 | Watanabe | 257/71 |
| 5,329,146 | 7/1994 | Soeda | 257/303 |

*Primary Examiner*—Wael M. Fahmy
*Assistant Examiner*—Hung Van Duong
*Attorney, Agent, or Firm*—Fleshner & Kim

[57] ABSTRACT

A memory device of the present invention allows high integration, improved operational speed, larger capacitance, improved isolation and/or reduced leakage current. The memory device includes a plurality of transistors parallel to each other and formed above a substrate. A bit line is perpendicular to each of the plurality of transistors, and is coupled to the transistors. A predetermined portion of each transistor is a storage node for a capacitor, and a plate surrounds the predetermined portion through a dielectric film.

14 Claims, 3 Drawing Sheets

MEMORY DEVICE AND FABRICATION METHOD THEREOF

TECHNICAL FIELD

The present invention relates to a memory device and a fabrication method thereof, and in particular, to an improved semiconductor memory device and a fabrication method thereof by which there is provided a plurality of memory cells parallel to a substrate and connected to a substantially perpendicular bit line.

BACKGROUND ART

FIGS. 1 and 2 are a cross-sectional view and an equivalent circuit diagram, respectively, of a conventional DRAM (Dynamic Random Access Memory). A memory cell includes a p well 2 formed in a predetermined part of a silicon substrate 1 manufactured through a p-type impurity doping process, and a pair of field oxide films 4, having doping layers 3 therebeneath, are formed at a predetermined distance therebetween to distinguish an element isolation region from an active region. A plurality of word lines 6' are connected to switching transistors and a transfer transistor gate electrode 6 formed at a predetermined part of the active region and the element isolation region on the substrate.

A capacitor includes a storage node electrode 7, a dielectric film 8, and a plate electrode 9, being combined with the switching transistors having a lower insulating film 10 therebetween. A contact hole is formed through insulating films formed on the switching transistors to expose a region of the switching transistors. A bit line 11 is formed on the upper insulating film 10' having the contact hole to be coupled to the exposed region.

FIG. 2 shows the equivalent circuit diagram of the DRAM cell. When a data signal to be stored is applied to a corresponding bit line 11 while a voltage exceeding the threshold voltage of the transfer transistor gate electrode 6 is applied to the corresponding word line 6', the transistor is turned on. The data is stored as a charge in the capacitor of the cell. After storage, the voltage of the word line 6' is lowered to switch off the transfer transistor and the data signal charge does not escape. When the stored data signal is read, a voltage is applied to the corresponding word line 6' again and the charge accumulated in the cell capacitor (a) is transmitted through the bit line 11 to a sense amplifier connected thereto. Through the abovementioned course, writing and reading operations are performed.

The conventional DRAM cell is disadvantageous since the field oxide film 4 is formed having the P well 2 and the element isolation region on the silicon substrate 1 (for example, a field insulation doping layer), isolation of the elements is difficult. Further, because the switching transistor is formed only on the silicon substrate, a cell array takes up a larger area. Only one surface of the storage node electrode 7 serves as a capacitor (a), and the capacity of the capacitor per cell area is limited. The operational speed is also delayed in accordance with a contact resistance between the switching transistor and a connection (b shown in FIG. 1) for the storage node electrode 7. Moreover, data may be lost by a leakage current generated at the contact region of the storage node electrode 7.

DISCLOSURE OF THE INVENTION

An advantage of the present invention is in increasing the integration of a semiconductor device.

Another advantage of the present invention is in increasing the operational speed.

A further advantage of the present invention is in increasing the capacitance of a capacitor.

Still another advantage of the present invention is in providing an improved isolation of semiconductor elements.

Another advantage of the present invention is in reducing leakage current.

The above advantages, objects and others are achieved in part by a semiconductor device comprising: a substrate; a plurality of transistors substantially parallel to each other and substantially parallel to a surface of the substrate, each transistor comprising a gate electrode formed over a semiconductive layer with a gate insulation formed therebetween, and first and second impurity regions formed in the semiconductive layer on opposite sides of the gate; an interlayer insulating layer formed between each of the plurality of transistors with a predetermined portion of the second impurity regions being exposed; a dielectric film formed on the predetermined portion which is exposed in each of the plurality of transistors; and a plate electrode formed on the dielectric film.

The present invention is also achieved in part by a memory device comprising: a plurality of memory cells and a plurality of wordlines and bitlines, each memory cell coupled to a corresponding wordline and a corresponding bitline, each memory cell comprising: a substrate; a transistor substantially parallel to a surface of the substrate, the transistor comprising a gate electrode formed over a semiconductive layer with a gate insulation formed therebetween, first and second impurity regions formed in the semiconductive layer on opposite sides of the gate, and the gate being coupled to a corresponding wordline and the first impurity region being coupled to a corresponding bitline; an insulating layer formed on the transistor with a predetermined portion of the second impurity regions being exposed; a dielectric film formed on the predetermined portion which is exposed; and a plate electrode formed on the dielectric film.

To achieve the above object, there is provided a semiconductor according to the present invention, including a substrate, a bit line vertically formed relative the substrate, a plurality of active layers being parallel to each other and connected perpendicular to the bit line, respectively and having a predetermined distance therebetween, a gate electrode formed on each of the plurality of active layers, first impurity regions formed at an inward portion of each of the plurality of active layers at one side of the gate electrode thereon, and connected to the bit line, second impurity regions formed at an outward portion of each of the plurality of active layers at another side of the gate electrode thereon, an interlayer insulating film formed between the active layers on which the gate electrodes are formed so that a predetermined portion of a surface of each second impurity region is exposed thereby, a dielectric film formed on the exposed surface of each second impurity region and the interlayer insulating film, and a plate electrode formed on the dielectric film.

To achieve the above object, there is provided a fabrication method for a semiconductor device according to the present invention including forming a first insulating film on a substrate in which a bit line connector is formed, forming an active layer on the first insulating film so that a predetermined portion of a surface of the first insulating film is exposed thereby, forming a gate electrode on the active layer, forming a first impurity region and a second impurity region in the active layer at left and right side portions of the gate electrode by performing an ion implantation using the gate electrode as a mask, forming an interlayer insulating film on the active layer having the first and the second impurity regions and the gate electrode thereon, repeatedly performing the above steps a plurality of times, etching the interlayer insulating film so that a predetermined portion of the second impurity region may be exposed thereby, forming a dielectric film on the exposed surface of the second impurity region and the interlayer insulating film, forming a plate electrode on the insulating film, surrounding the surface of the dielectric film, forming a bit line contact hole by etching the interlayer insulating film and the first impurity region so that a predetermined portion of a surface of the bit line connector may be exposed thereby, and forming a bit line at the predetermined portion of the interlayer insulating film having the bit line contact hole.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
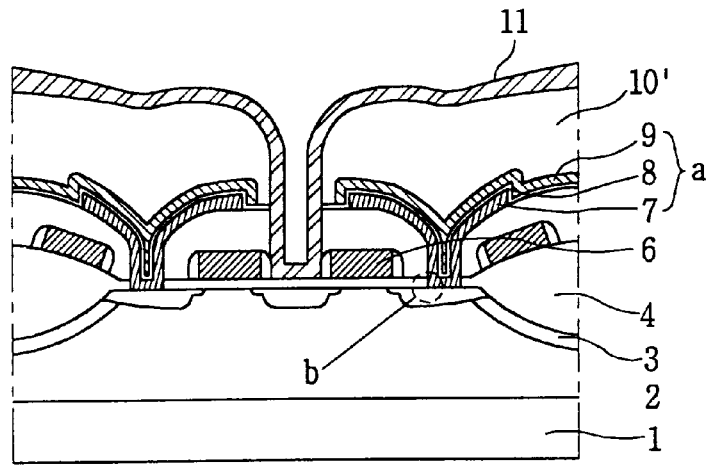
FIG. 1 is a cross-sectional view of a DRAM cell in accordance with the conventional art.
Figure 2:
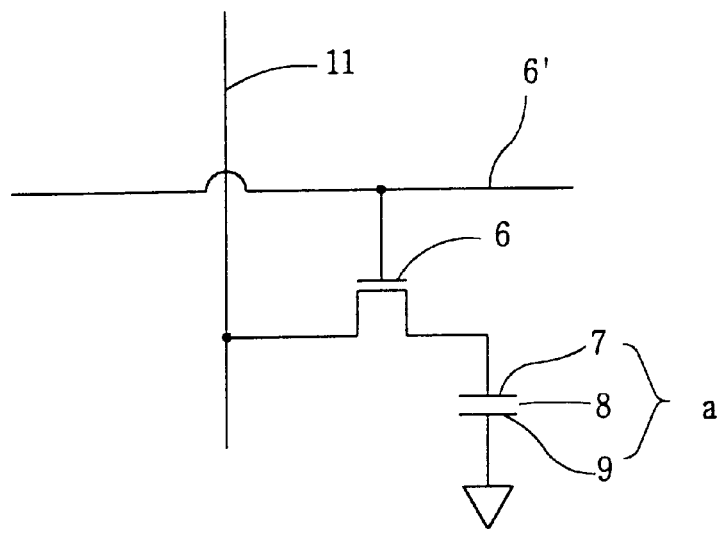
FIG. 2 is an equivalent circuit diagram of a DRAM cell illustrated in FIG. 1.
Figure 3:
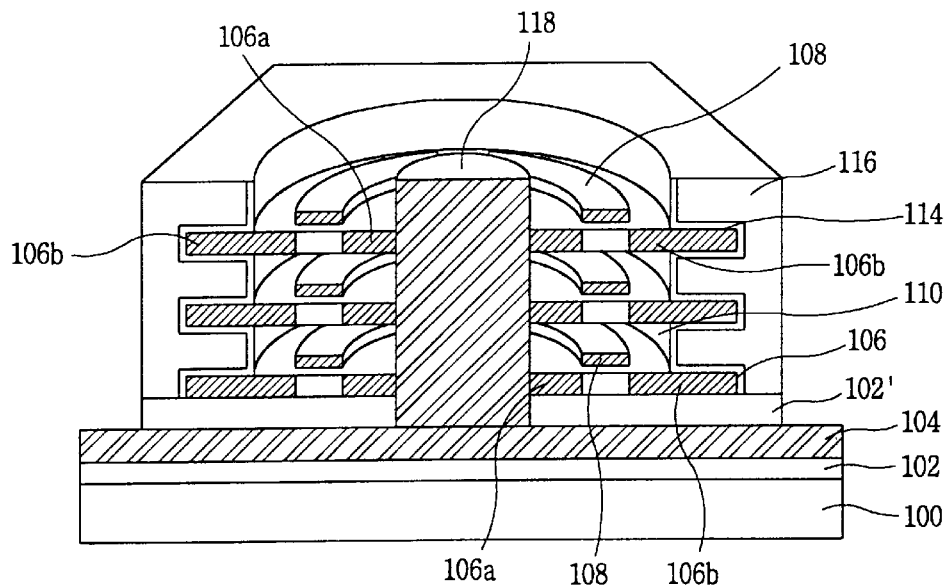
FIG. 3 is a cross-sectional view of a DRAM cell in accordance with the present invention.

FIG. 3 is a cross-sectional view showing the construction of a DRAM cell manufactured according to the present invention, and FIGS. 4a–4e are views showing the various steps for making the DRAM cell illustrated in FIG. 3. A DRAM cell according to the present invention includes a first insulating film 102 and a bit line connector 104 of a conductive film which are successively formed on a silicon substrate 100. A cylindrical bit line 118 of a conductive film is formed on a predetermined portion of the bit line connector 104, and is vertically formed with respect to the silicon substrate 100, A second insulating film 102' is formed by burying a predetermined portion of the bit line 118 on the bit line connector 104. A plurality of active layers 106 are parallel to each other and have a predetermined distance therebetween whereby the bit line 118 passes perpendicularly through the middle of such active layers 106.

Each active layer 106 comprises a first impurity region 106a, which is in contact with the bit line 118, one side of an active region located below a gate electrode 108, and a second impurity region 106b. The gate electrode 108 of a transfer transistor is formed on a predetermined portion of each of the plurality of active layers 106. A predetermined portion of the active layer 106 adjacent each gate electrode 108 formed as the first impurity region 106a and a predetermined other portion of the active layer 106 adjacent each gate electrode 108 formed as the second impurity region 106b. An interlayer insulating film 110 is formed between the active layers 106 in such a manner that a predetermined portion of the second impurity region 106b of each active layer 106 is exposed therethrough. A dielectric film 114 is formed around the exposed portions of the second impurity regions 106b of each active layer 106 and the interlayer insulating films 110 therebetween. A plate electrode 116 is formed in such a manner that the dielectric film 114 is surrounded thereby.

The first and the second impurity regions 106a and 106b are used as source and drain regions of the transfer transistor controlled by the gate electrode 108. The second impurity region 106b formed in the active layer 106 is also used as a storage node electrode of a capacitor. In other words, the DRAM cell shown in the present invention has a construction in which a transfer transistor and a capacitor are respectively formed in each of the plurality of active layers.

Figure 4A:
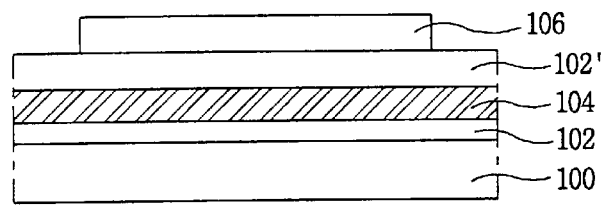
FIGS. 4a through 4e depict the steps for fabricating the DRAM cell illustrated in FIG. 3.

As shown in FIG. 4a, after the first insulating film 102 is formed on the silicon substrate 100, the bit line connector 104, made of a conductor film material, is formed thereon. The second insulating film 102' is formed for burying the bit line, which is to be formed on the bit line connector 104. The active layer 106, made of a polysilicon or single crystal silicon, is formed on a predetermined portion of the second insulating film 102'. For isolating the active layer from another active layer, the active layer is selectively etched.

The thickness of the first insulating film 102 is about 2000 to 10000 angstroms, preferably 5000 angstroms. The thickness of the second insulating film 102' is about 2000 to 6000 angstroms. The first and second insulating films 102 and 102' are formed by chemical vapor deposition (CVD).

The thickness of the conductive film 104 is about 2000 to 4000 angstroms. The conductive film can be formed by CVD or sputtering process. The conductive film 104 includes a semiconductor layer (such as doped polysilicon) and a metal layer (such as refractory metal W, Ti or Ta).

Figure 4B:
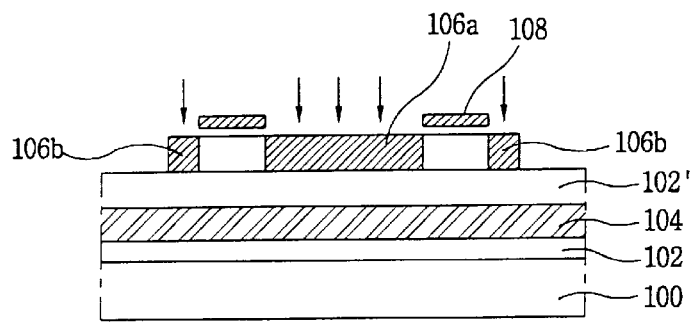

As shown in FIG. 4b, a gate insulating film 107 is formed, and the gate electrodes 108 are formed on the gate insulating films. The first and the second impurity regions 106a and 106b, which serve as source and drain regions, are formed by implanting impurity ions using the gate electrode 108 as a mask. For NMOS transistor, the impurity is As or Ph. For PMOS transistor, the impurity is B or $BH_2$. As a result, a transfer transistor and a storage node electrode of a first layer are formed.

The gate insulating film 107 can be formed by thermal oxidation process and CVD and the thickness thereof is about 100 to 200 angstroms. The gate electrode 108 can be formed by depositing a polysilicon layer on the gate insulation film to a thickness of about 1000 to 2000 angstroms, and selectively etching the polysilicon layer.

Figure 4C:
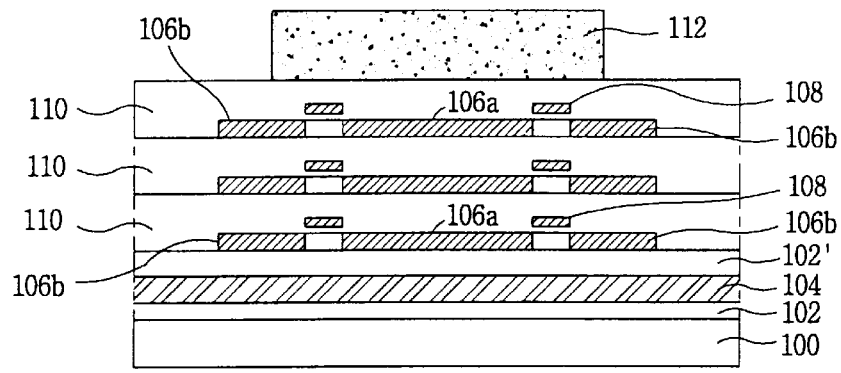

With reference to FIG. 4c, the interlayer insulating film 110 is formed on the second insulating film 102' having the transfer transistor and the storage node electrode of the first layer.

The interlayer insulating film can be an oxide film and the thickness is about 10000 to 15000 angstroms. The interlayer insulating film can be formed by CVD.

The process in FIG. 4b is repeatedly performed on each subsequently formed interlayer insulating film 110, as much as needed.

For example, a transfer transistor, a storage node electrode and the interlayer insulating film 110 of a second layer, having the same construction as those of the first-layer, are formed on the second interlayer insulating film 110. Likewise, a transfer transistor, a storage node electrode and the interlayer insulating film 110 of a third layer, having the same construction as the first layer, are formed on the third interlayer insulating film 110.

Next, a photoresist film pattern 112 is formed at a predetermined portion on the interlayer insulating film 110 formed on the transfer transistor and the storage node electrode of the third layer. Using the photoresist film pattern 112 as a mask, the interlayer insulating films 110 thereunder are anisotropically etched until the second insulating layer is exposed. Thereafter, using the photoresist film pattern 112 as a mask, a predetermined portion of the surface of the second impurity region 106b in the active layer 106 is exposed.

Figure 4D:
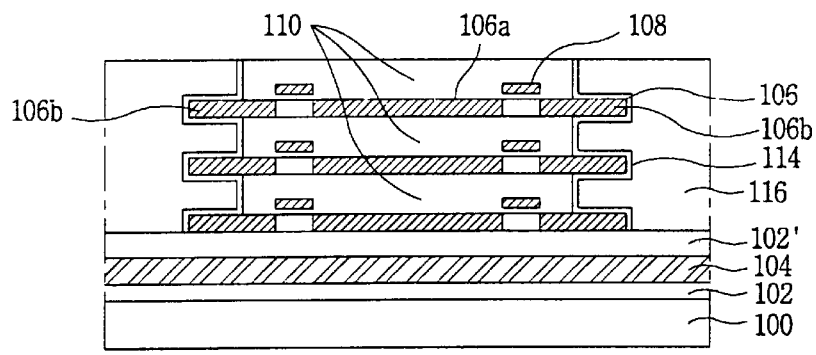

As shown in FIG. 4d, the dielectric film 114, such as an oxide film or an oxi-nitride film having a thickness of about 50 to 100 angstroms, is formed on the second impurity region 106b where the surface is exposed and the etched surface of the interlayer insulating film 110. The dielectric film can be formed by (1) thermal oxidation or (2) after forming the oxide film, nitrifying the oxide film in a nitrogen environment. The plate electrode 116 made of a conductive film material, such as a doped polysilicon, is formed on the second insulating film 102' so that the surface of the dielectric film 114 may be surrounded thereby.

Figure 4E:
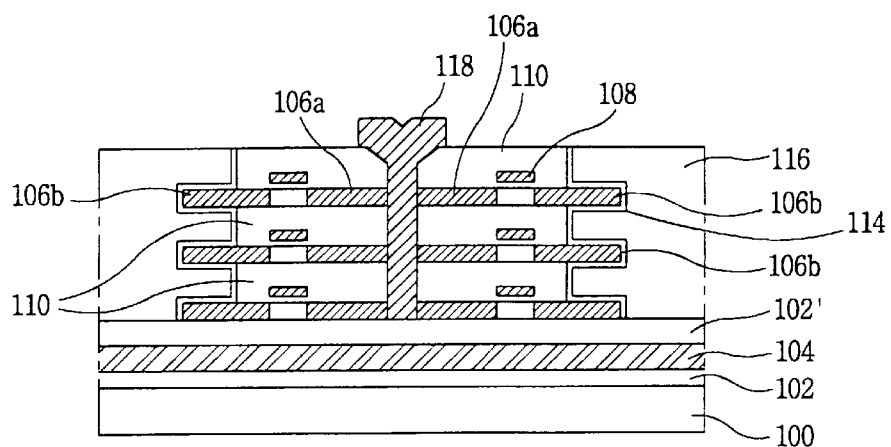

Finally, as shown in FIG. 4e, a bit line contact hole is formed by etching the interlayer insulating film 110 and the first impurity region 106a so that a predetermined portion of the surface of the bit line connector 104 between the gate electrodes 108 may be exposed. The production process is completed by forming the bit line 118 at a predetermined portion of the interlayer insulating film 110 having the bit line contact hole. As a result, a plurality of the surfaces of the storage node electrodes can be used as capacitors and the capacitance per cell area may be increased.

As described in detail above, the present invention has the desired effects that a cell array area can be reduced to achieve high integration, since a plurality of cells may be formed within the identical occupying area by manufacturing a memory cell with a bit line being vertically formed relative to a substrate, and a transfer transistor and a capacitor being formed at each of a plurality of active layers connected to the bit line. An element isolation is easily performed since a storage node electrode of a transfer transistor and a capacitor is formed on an insulating film in comparison with the conventional art. The capacitance per unit area can be increased since a plurality of surfaces of the storage node electrode can be used as a capacitor. The delay in the operation speed caused by the contact resistance is reduced, since source/drain regions of the transfer transistor and the storage node electrode are formed in the same layer. The leakage current can be reduced to a large extent and data preservation can be improved since the storage node electrode of the capacitor is isolated by an insulating film and cannot form a connection path with the substrate.

The foregoing embodiment is merely exemplary and not to be construed as limiting the present invention. The present scheme can be readily applied to other types of memory devices. One of ordinary skill in the art can use the teachings of the present invention to other devices requiring high integration, improved operational speed, larger capacitance, improved isolation and/or reduced leakage current. The description of the present invention is intended to be illustrative, and not limiting the scope of the claims. Many alternatives, modifications and variations will be apparent to those skilled in the art.

I claim:

1. A semiconductor device, comprising:

a substrate;

a bit line vertically formed relative the substrate;

a plurality of active layers being parallel to each other and connected perpendicular to the bit line and having a predetermined distance therebetween;

a gate electrode formed on each of the plurality of active layers;

first impurity regions formed at an inward portion of each of the plurality of active layers at one side of the gate electrode thereon, and connected to the bit line;

second impurity regions formed at an outward portion of each of the plurality of active layers at another side of the gate electrode thereon;

an interlayer insulating film formed between the active layers on which the gate electrodes are formed so that a predetermined portion of a surface of each second impurity region is exposed thereby;

a dielectric film formed on the exposed surface of each second impurity region and the interlayer insulating film; and a plate electrode formed on the dielectric film.

2. The semiconductor device of claim 1, wherein said bit line is of conductive film material.

3. The semiconductor device of claim 1, wherein said plurality of active layers are of semiconductor film material.

4. A semiconductor device comprising:

a substrate;

a plurality of transistors formed stacked over each other and substantially parallel to a surface of said substrate, each transistor comprising a gate electrode formed over a semiconductive layer with a gate insulation formed therebetween, and first and second impurity regions formed in said semiconductive layer on opposite sides of said gate;

an interlayer insulating layer formed between each of said plurality of transistors with a predetermined portion of said second impurity regions being exposed;

a dielectric film formed on said predetermined portion which is exposed in each of said plurality of transistors; and a plate electrode formed on said dielectric film.

5. The semiconductor device of claim 4, further comprising a conductive layer which is substantially perpendicular to said plurality of transistors and the surface of the substrate, said conductive layer being coupled to said first impurity region such that a predetermined potential is at least one of stored in the second impurity region which is overlapped by said plate electrode and transmitted to said conductive layer.

6. The semiconductor device of claim 4, wherein each of said plurality of transistors is separated by a predetermined distance.

7. The semiconductor device of claim 4, wherein said plate electrode is unitary.

8. The semiconductor device of claim 4, wherein the predetermined portion of the second impurity region of a transistor closest to the substrate is exposed on two surfaces of the semiconductive layer.

9. The semiconductor device of claim 8, wherein the predetermined portion of the second impurity region of a transistor above said transistor closest to the substrate is exposed on three surfaces of the semiconductive layer.

10. The semiconductor device of claim 5, wherein said conductive layer is substantially cylindrical.

11. A memory device comprising:

a plurality of memory cells and a plurality of wordlines and bitlines, each memory cell coupled to a corresponding wordline and a corresponding bitline, each memory cell comprising:

a substrate;

a transistor substantially parallel to a surface of said substrate, said transistor comprising a gate electrode formed over a semiconductive layer with a gate insulation formed therebetween, first and second impurity regions formed in said semiconductive layer on opposite sides of said gate, and said gate being coupled to a corresponding wordline and said first impurity region being coupled to a corresponding bitline;

an insulating layer formed on said transistor with a predetermined portion of said second impurity regions being exposed;

a dielectric film formed on said predetermined portion which is exposed; and a plate electrode formed on said dielectric film, wherein the predetermined portion of the second impurity region is exposed on two surfaces of the semiconductive layer.

12. The memory device of claim 11, wherein each bit line comprises a conductive layer which is substantially perpendicular to said transistor and the surface of the substrate, said conductive layer being coupled to said first impurity region such that a predetermined potential is at least one of stored in the second impurity region which is overlapped by said plate electrode and transmitted to said conductive layer.

13. The memory device of claim 11, wherein the predetermined portion of the second impurity region further includes a third surface of the semiconductive layer.

14. The memory device of claim 12, wherein said conductive layer is substantially cylindrical.

* * * * *